(12) United States Patent
Anglin Williams

(10) Patent No.: US 11,844,197 B2
(45) Date of Patent: Dec. 12, 2023

(54) FLEXIBLE RETENTION RING FOR THERMAL INTERFACE MATERIAL

(71) Applicant: Intel Corporation, Santa Clara, CA (US)

(72) Inventor: Raymon S. Anglin Williams, Folsom, CA (US)

(73) Assignee: Intel Corporation, Santa Clara, CA (US)

(*) Notice: Subject to any disclaimer, the term of this patent is extended or adjusted under 35 U.S.C. 154(b) by 689 days.

(21) Appl. No.: 16/811,338

(22) Filed: Mar. 6, 2020

(65) Prior Publication Data

US 2020/0214175 A1 Jul. 2, 2020

(51) Int. Cl.
*H05K 7/20* (2006.01)

(52) U.S. Cl.
CPC .................. *H05K 7/20454* (2013.01)

(58) Field of Classification Search
CPC .... H05K 7/20454–20463; H01L 23/42; H01L 23/433–4334
See application file for complete search history.

(56) References Cited

U.S. PATENT DOCUMENTS

| | | | | |
|---|---|---|---|---|
| 2,161,080 A * | 6/1939 | Murphy | ................. | B29C 41/14 450/39 |
| 2,880,902 A * | 4/1959 | Owsen | ..................... | A45F 3/20 285/302 |
| 6,665,186 B1 * | 12/2003 | Calmidi | ................ | H01L 23/473 361/708 |
| 7,382,620 B2 * | 6/2008 | Khanna | .................. | H01L 23/42 361/708 |
| 7,440,281 B2 * | 10/2008 | Bailey | ..................... | H01L 23/26 360/97.12 |
| 7,755,184 B2 * | 7/2010 | Macris | .................... | H01L 23/42 257/E23.101 |
| 9,044,082 B2 * | 6/2015 | Kusuma | ..................... | A45F 3/20 |
| 9,958,914 B2 * | 5/2018 | Kim | ........................ | G06F 1/20 |
| 10,085,364 B2 * | 9/2018 | Voss | ................... | H05K 7/20436 |
| 11,031,319 B2 * | 6/2021 | Wu | ...................... | H01L 21/4871 |
| 2006/0087816 A1 * | 4/2006 | Ewes | .................... | H01L 23/427 257/E23.088 |
| 2006/0220225 A1 * | 10/2006 | Ni | ......................... | H01L 23/433 257/E23.09 |
| 2007/0211445 A1 * | 9/2007 | Robinson | .............. | H01L 23/552 361/818 |
| 2009/0146294 A1 * | 6/2009 | Hillman | .................. | H01L 23/42 257/714 |

OTHER PUBLICATIONS

"The Properties and Advantages of PTFE", Jul. 19, 2016, https://www.fluorotec.com/news/blog/the-properties-and-advantages-of-polytetrafluoroethylene-ptfe/ (Year: 2016).*

* cited by examiner

Primary Examiner — Zachary Pape
(74) Attorney, Agent, or Firm — Essential Patents Group, LLP

(57) ABSTRACT

An embodiment of an electronic apparatus may include an electronic device package having a first surface, a heat conductive structure having a second surface, a reservoir structure positioned between the first surface of the electronic device package and the second surface of the heat conductive structure, and a thermal interface material disposed within the reservoir structure between the first surface of the electronic device package and the second surface of the heat conductive structure to place the first surface in thermal communication with the second surface. Other embodiments are disclosed and claimed.

16 Claims, 11 Drawing Sheets

FLEXIBLE RETENTION RING FOR THERMAL INTERFACE MATERIAL

BACKGROUND

Thermal interface material (TIM) refers to a material which may be positioned between two devices to facilitate a thermal coupling between the two devices. Applications for TIM include heat dissipation for electronic devices where the TIM is positioned between a heat-producing device (e.g., an electronic component) and a heat-dissipating structure (e.g., a heat sink). Non-limiting examples of TIM include thermally conductive pads or foam, thermal tape, liquid TIM (LTIM, e.g., such as thermal grease, thermal glue, thermal gap filler, etc.), phase-change materials (PCM), polymeric TIMs, and metal TIMs.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
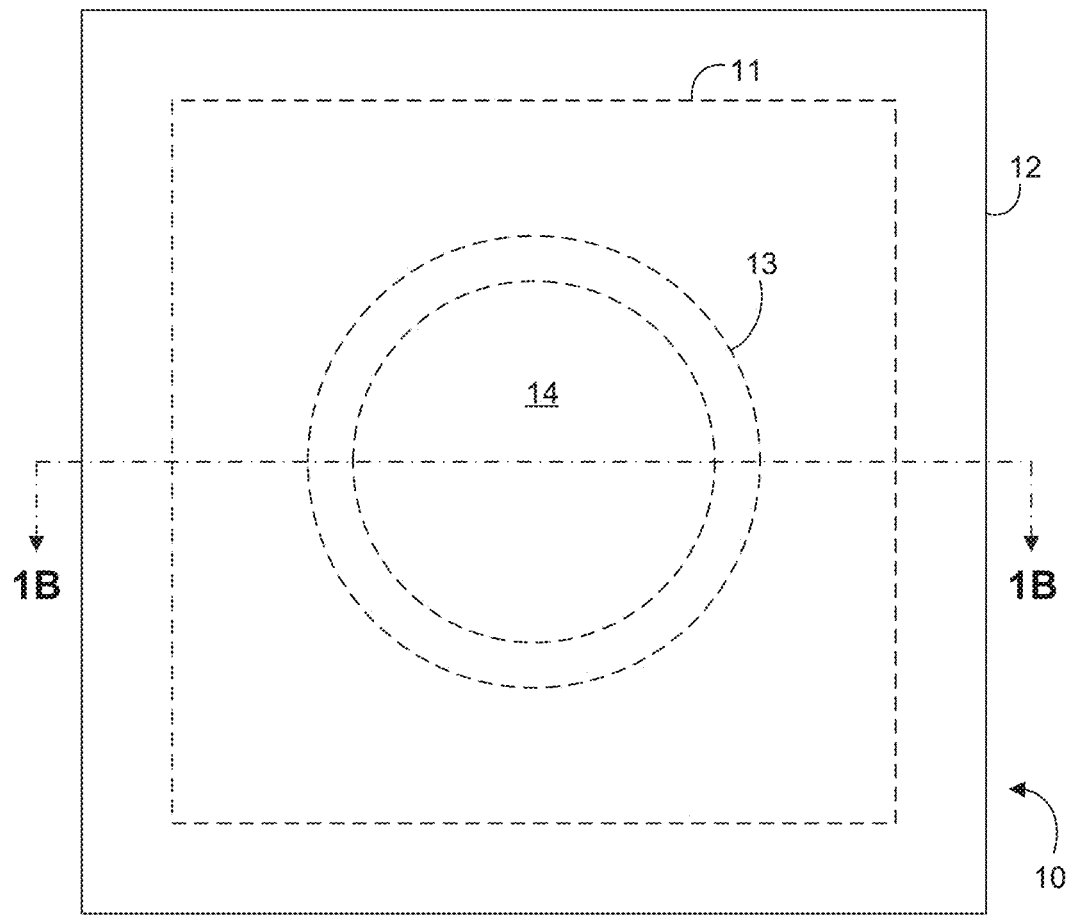
FIG. 1A is a block diagram of an example of an electronic apparatus according to an embodiment.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

While the following description sets forth various implementations that may be manifested in architectures such as system-on-a-chip (SoC) architectures for example, implementation of the techniques and/or arrangements described herein are not restricted to particular architectures and/or computing systems and may be implemented by any architecture and/or computing system for similar purposes. For instance, various architectures employing, for example, multiple integrated circuit (IC) chips and/or packages, and/or various computing devices and/or consumer electronic (CE) devices such as set top boxes, smartphones, etc., may implement the techniques and/or arrangements described herein. Further, while the following description may set forth numerous specific details such as logic implementations, types and interrelationships of system components, logic partitioning/integration choices, etc., claimed subject matter may be practiced without such specific details. In other instances, some material such as, for example, control structures and full software instruction sequences, may not be shown in detail in order not to obscure the material disclosed herein.

The material disclosed herein may be implemented in hardware, firmware, software, or any combination thereof. The material disclosed herein may also be implemented as instructions stored on a machine-readable medium, which may be read and executed by one or more processors. A machine-readable medium may include any medium and/or mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others.

References in the specification to "one implementation", "an implementation", "an example implementation", etc., indicate that the implementation described may include a particular feature, structure, or characteristic, but every embodiment may not necessarily include the particular feature, structure, or characteristic. Moreover, such phrases are not necessarily referring to the same implementation. Further, when a particular feature, structure, or characteristic is described in connection with an embodiment, it is submitted that it is within the knowledge of one skilled in the art to effect such feature, structure, or characteristic in connection with other implementations whether or not explicitly described herein.

Figure 1B:
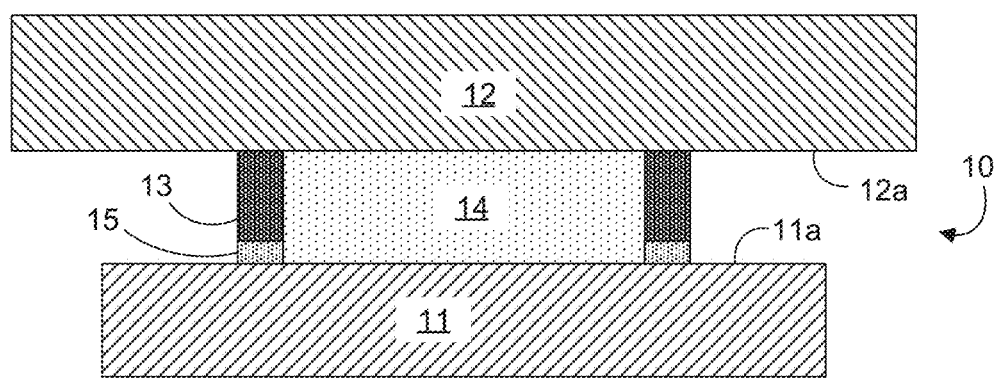
FIG. 1B is a cross section view taken along line 1B-1B in FIG. 1A.

With reference to FIGS. 1A and 1B, an embodiment of an electronic apparatus 10 may include an electronic device package 11 having a first surface 11a, a heat conductive structure 12 having a second surface 12a, a reservoir structure 13 positioned between the first surface 11a of the electronic device package 11 and the second surface 12a of the heat conductive structure 12, and a thermal interface material (TIM) 14 disposed within the reservoir structure 13 between the first surface 11a of the electronic device package 11 and the second surface 12a of the heat conductive structure 12 to place the first surface 11a in thermal communication with the second surface 12a. In some embodiments, the reservoir structure 13 may comprise a band of flexible material (e.g., rubber, foam, etc.). For example, the band may comprise a ring of compressible material (e.g., an o-ring). In some embodiments, the ring of compressible material may comprise a spring coil. In another example, the band may comprise a collapsible ring. For example, the collapsible ring may comprise two or more concentric cylinders. In some embodiments, the TIM 14 may comprise liquid thermal interface material (LTIM). Non-limiting examples which are suitable for the heat conductive structure 12 include a heatsink, a liquid cooling device, an enclosure of the electronic apparatus 10, etc. Some embodiments of the apparatus 10 may further include a thermal adhesive 15 (e.g., thermal tape, thermal glue, etc.) positioned between the reservoir structure 13 and the first surface 11a of the electronic device package 11.

Figure 2A:
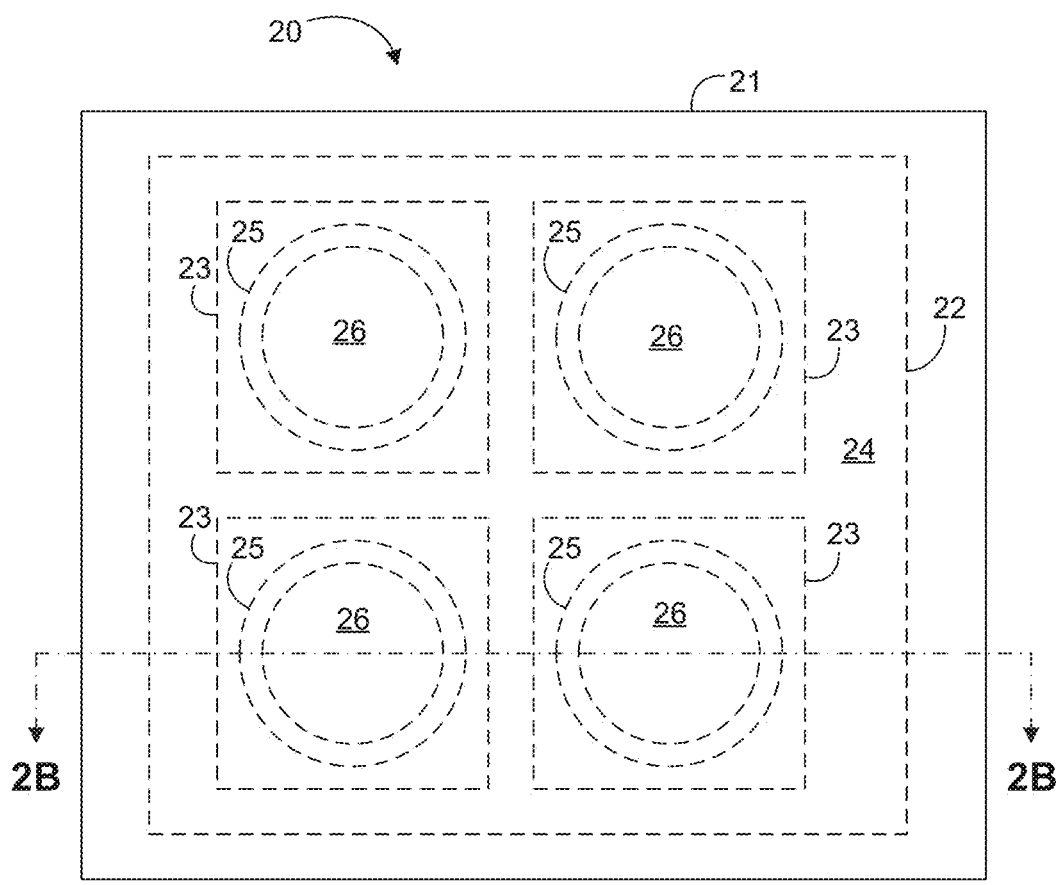
FIG. 2A is a block diagram of an example of an electronic memory apparatus according to an embodiment.
Figure 2B:
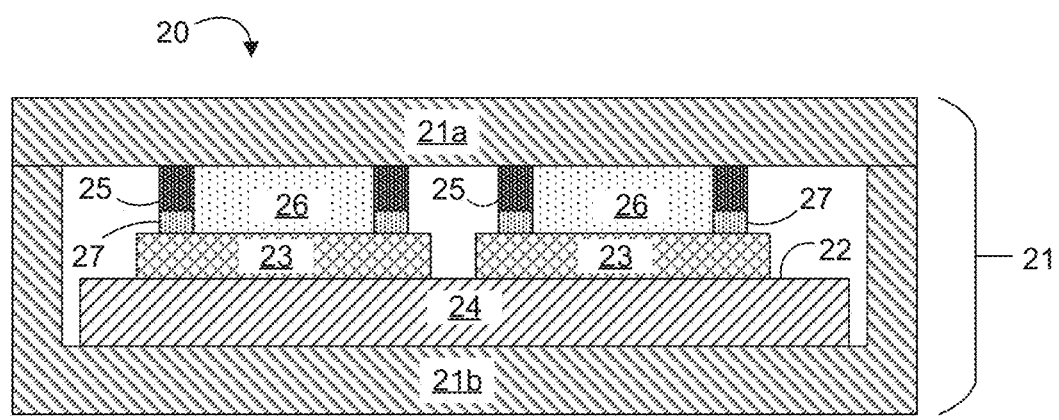
FIG. 2B is a cross section view taken along line 2B-2B in FIG. 2A.

With reference to FIGS. 2A and 2B, an embodiment of an electronic memory apparatus 20 may include an enclosure 21 having a first side 21a and a second side 21b opposed to the first side 21a, where at least the first side 21a of the enclosure 21 comprises a thermally conductive material. The apparatus 20 further includes a memory device 22 positioned within the enclosure 21 and disposed between the first and second sides 21a, 21b of the enclosure 21. The memory device 22 includes two or more electronic components 23 secured to a substrate 24. The apparatus 20 further includes one or more reservoir structures 25 respectively formed between one or more of the two more electronic components 23 of the memory device 22 and the first side 21a of the enclosure 21, and TIM 26 retained within the one or more reservoir structures 25 and in thermal communication with both the respective electronic components 23 and the first side 21a of the enclosure 21. In some embodiments, at least one of the reservoir structures 25 may comprise a band of flexible material (e.g., rubber, foam, etc.). For example, the band may comprise a ring of compressible material (e.g., an o-ring). In some embodiments, the ring of compressible material may comprise a spring coil. In another example, the band may comprise a collapsible ring. For example, the collapsible ring may comprise two or more concentric cylinders. In some embodiments, the TIM 26 may comprise LTIM. Some embodiments of the apparatus 20 may further include a thermal adhesive 27 (e.g., thermal tape, thermal glue, etc.) respectively positioned between the one or more reservoir structures 25 and the one or more of the two or more electronic components 23 of the memory device 22.

Figure 3:
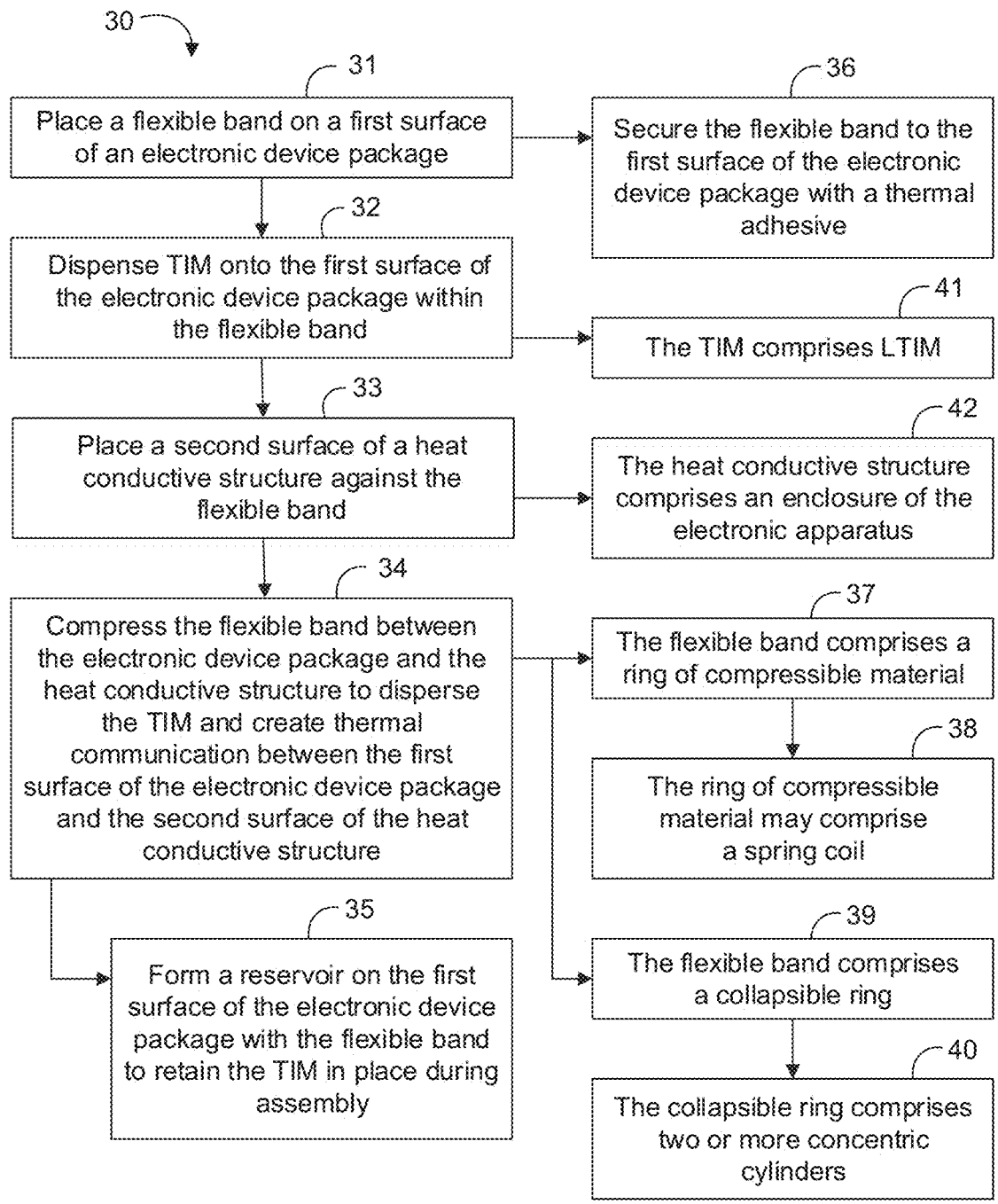
FIG. 3 is a flowchart of an example of a method of assembling an electronic apparatus according to an embodiment.

With reference to FIG. 3, an embodiment of a method 30 of assembling an electronic apparatus may include placing a flexible band on a first surface of an electronic device package at block 31, dispensing TIM onto the first surface of the electronic device package within the flexible band at block 32, placing a second surface of a heat conductive structure against the flexible band at block 33, and compressing the flexible band between the electronic device package and the heat conductive structure to disperse the TIM and create thermal communication between the first surface of the electronic device package and the second surface of the heat conductive structure at block 34. For example, the method 30 may include forming a reservoir on the first surface of the electronic device package with the flexible band to retain the TIM in place during assembly at block 35.

Some embodiments of the method 30 may further include securing the flexible band to the first surface of the electronic device package with a thermal adhesive at block 36. In some embodiments, the flexible band may comprise a ring of compressible material at block 37. For example, the ring of compressible material may comprise a spring coil at block 38. In another example, the flexible band may comprise a collapsible ring at block 39. For example, the collapsible ring may comprise two or more concentric cylinders at block 40. In any of the embodiments herein, the TIM may comprise LTIM at block 41. In some embodiments, the heat conductive structure may comprise an enclosure of the electronic apparatus at block 42.

Some embodiment may advantageously provide a flexible retention ring for LTIM. LTIM may be used during assembly of various electronic products including, for example, solid state drive (SSD) products. The LTIM dispensing process is important because the correct application between electronic components and the SSD enclosure creates a proper thermal dissipation environment to avoid overheating of the electronic components during SSD operation. Unfortunately, problems like LTIM smears, an excess of LTIM, or a shortage of LTIM may occur due to multiple process and material issues like improper dispensing, LTIM liquefying problems, SSD assembly or handling issues. Some embodiments may advantageously overcome one or more the foregoing problems.

Some embodiments, for example, may include technology to place a flexible retention ring on top of the electronic components that require LTIM application. Advantageously, the ring helps contain the LTIM in its place on top of the electronic component and may avoid or reduce smearing. In accordance with some embodiment, the retention ring may have the flexibility to adjust to the height between the electronic component and the top SSD enclosure. After the flexible retention ring is in place on the electronic component, the LTIM may be dispensed inside the ring. The height of the flexible retention ring automatically adjusts after the top of the SSD enclosure is placed onto the assembly. During placement of the top of the SSD enclosure, some of the LTIM may overflow. Such overflow does not present a serious problem, however, because most of the LTIM remains inside the flexible retention ring to provide good thermal contact between the electronic component and the heat-dissipating top of the SSD enclosure. In any event, embodiments of the appropriately sized and placed flexible retention ring advantageously reduce the LTIM application issues related to smearing, application excess, or LTIM shortage. The improved assembly process and resulting apparatus/device/product advantageously ensures that electronic components that require thermal dissipation through LTIM keep the LTIM in place more robustly regardless of application problems or handling issues.

Figure 4A:
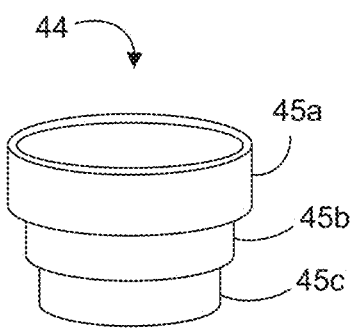
FIGS. 4A and 4B are perspective views of an example of a flexible retention ring in according to an embodiment.
Figure 4B:
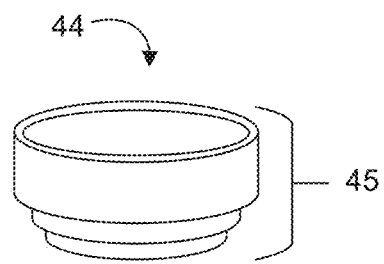

With reference to FIGS. 4A and 4B, an embodiment of a flexible retention ring 44 may include a collapsible ring consisting of concentric cylinders 45a to 45c (collectively "45"). The ring 44 may be configured to transition from an expanded state (e.g., see FIG. 4A) to a compressed or collapsed state (e.g., see FIG. 4B). When the flexible retention ring 44 is placed on top of an electronic component that requires LTIM application, the ring 44 will help contain the LTIM in its place and will help to avoid or reduce smearing. The flexible retention ring 44 has the flexibility to adjust to the gap between the electronic component and a heat-dissipating structure (e.g., the top of an SSD enclosure). The retention ring could be made with a flexible material with concentrically placed cylinders that will allow the ring 44 to collapse or expand (e.g., similar to a collapsible drinking cup, a 'Pop Socket' used for holding cellular phones, etc.).

Figure 5A:
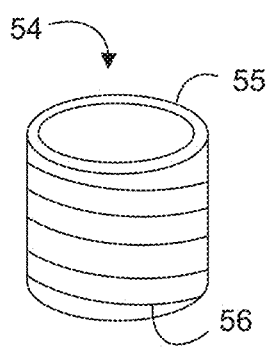
FIGS. 5A and 5B are perspective views of another example of a flexible retention ring in according to an embodiment.
Figure 5B:
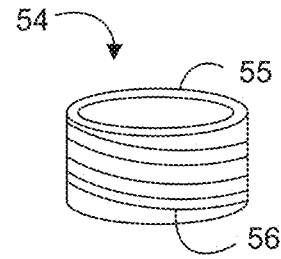

With reference to FIGS. 5A and 5B, an embodiment of a flexible retention ring 54 may include a cylinder 55 with an internal spring coil 56. The ring 54 may be configured to transition from an expanded state (e.g., see FIG. 5A) to a compressed or collapsed state (e.g., see FIG. 5B). When the flexible retention ring 54 is placed on top of an electronic component that requires LTIM application, the ring 54 will help contain the LTIM in its place and will help to avoid or reduce smearing. The flexible retention ring 54 has the flexibility to adjust to the gap between the electronic component and a heat-dissipating structure (e.g., the top of an SSD enclosure).

Those skilled in the art will appreciate that numerous other designs and materials may be utilized to make a suitable flexible retention ring, as long as the LTIM can be properly contained and the ring has the flexibility to adjust its height as needed for the electronic component to be thermally coupled to the desired heat-dissipating structure. Those skilled in the art will further appreciate that suitable shapes and structures, other than circular or ring-shaped, may be utilized for other embodiments of a flexible retention structure, depending on the particular application/device/product to assemble.

Figure 6A:
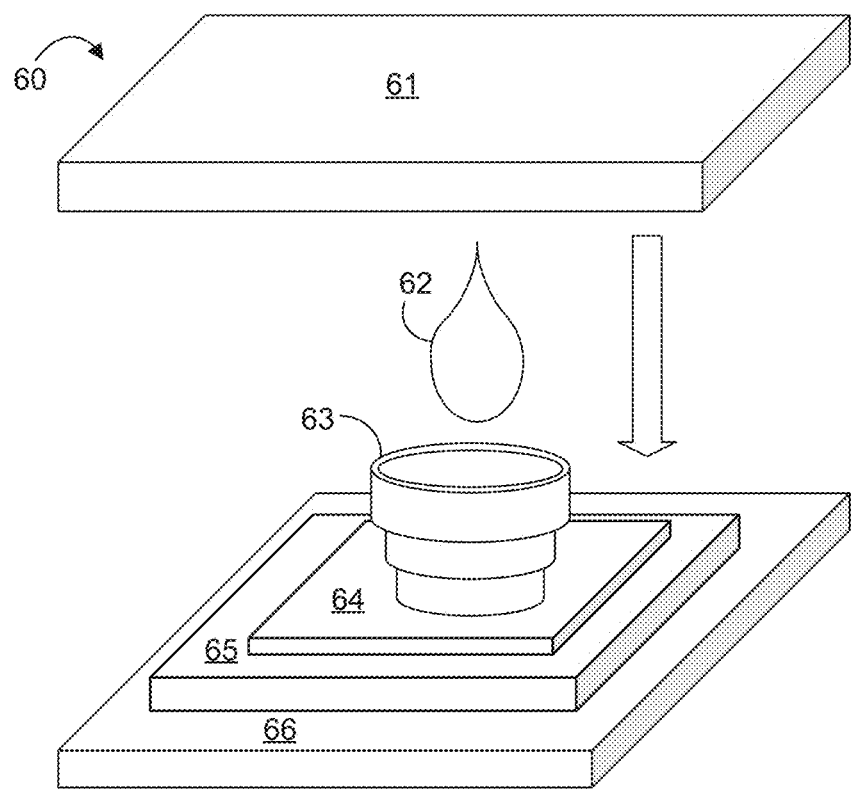
FIG. 6A is a partially exploded perspective view of another example of an electronic memory apparatus according to an embodiment.
Figure 6B:
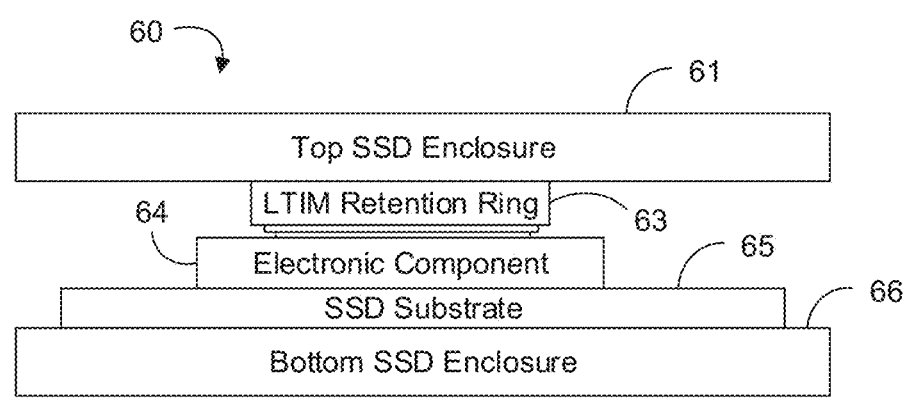
FIG. 6B is a block diagram side view of the assembled electronic memory apparatus from FIG. 6A.
Figure 7A:
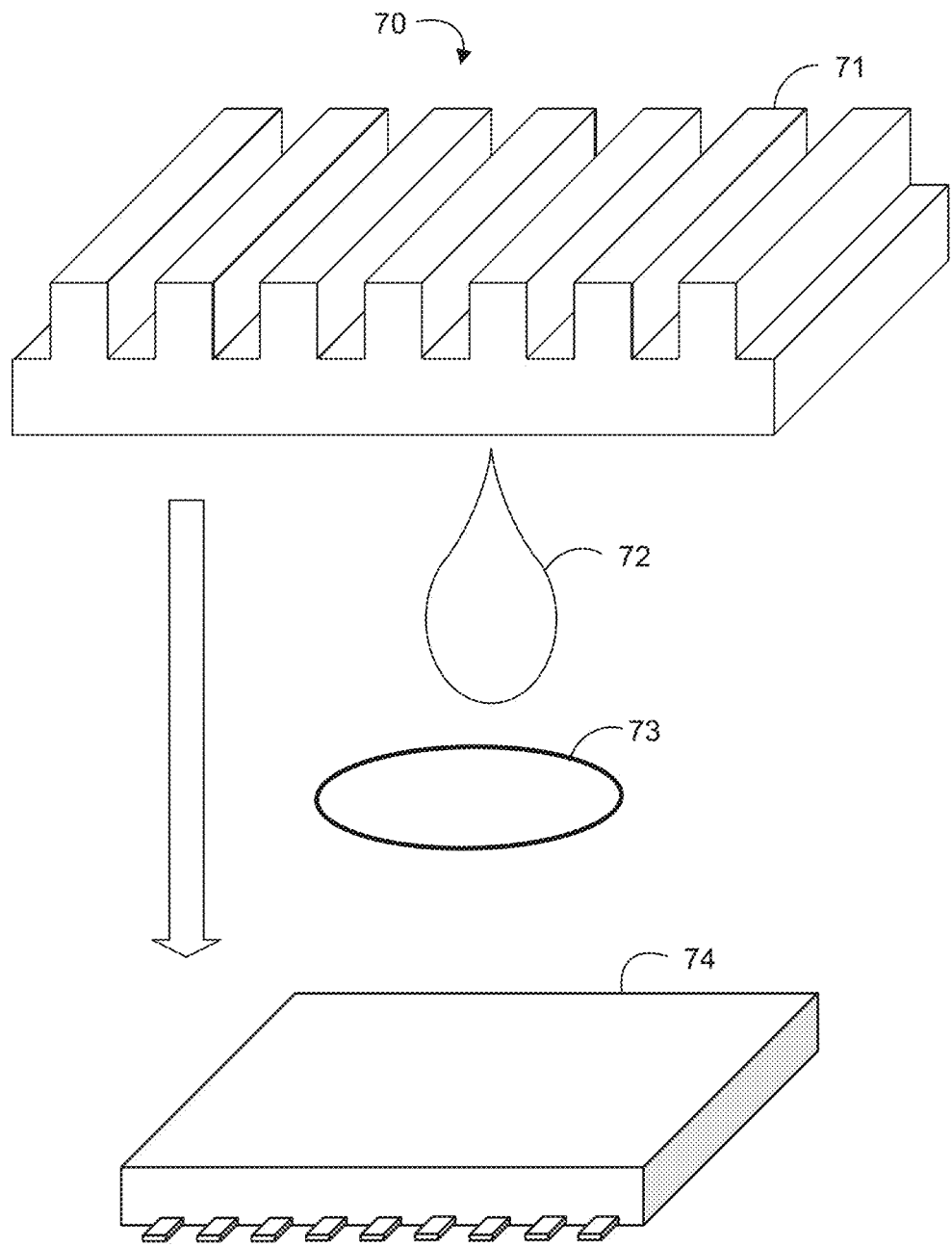
FIGS. 7A to 7E are respective exploded, perspective, side views, and partial cross section views of an assembly process for another electronic apparatus according to an embodiment.
Figure 7B:
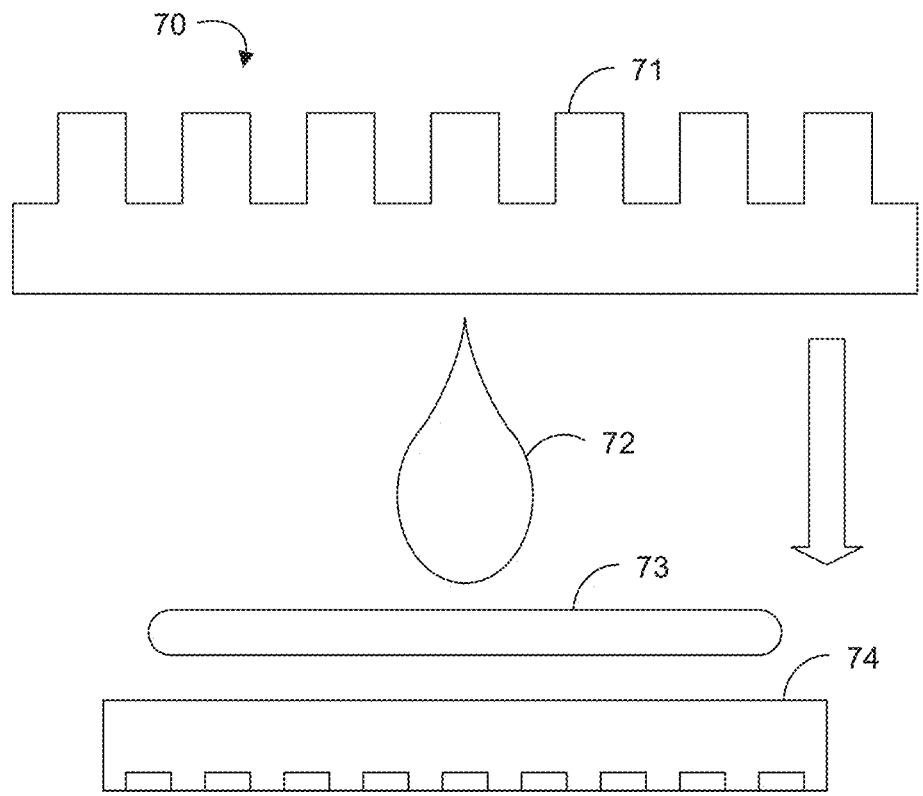
Figure 7C:
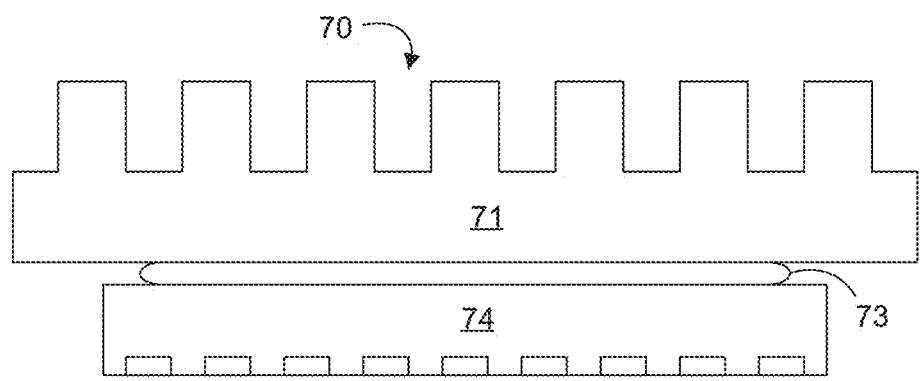
Figure 7D:
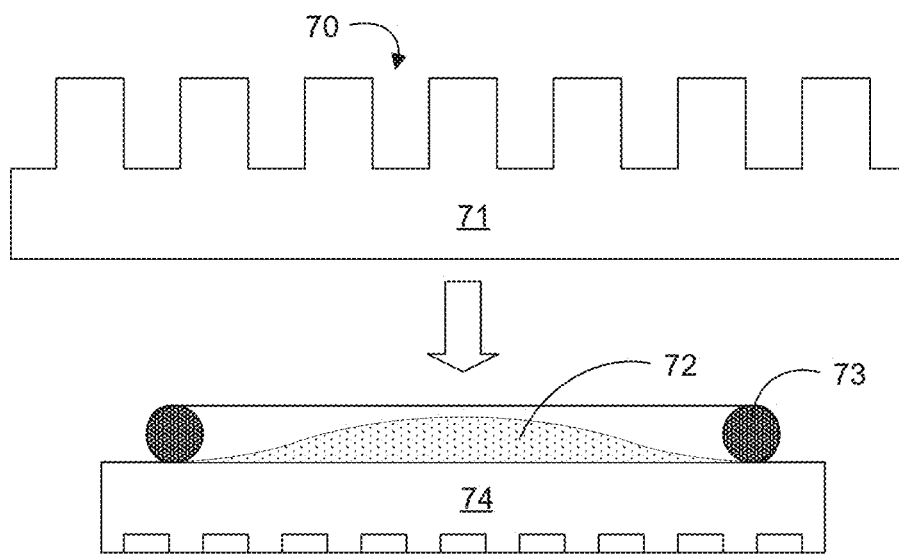
Figure 7E:
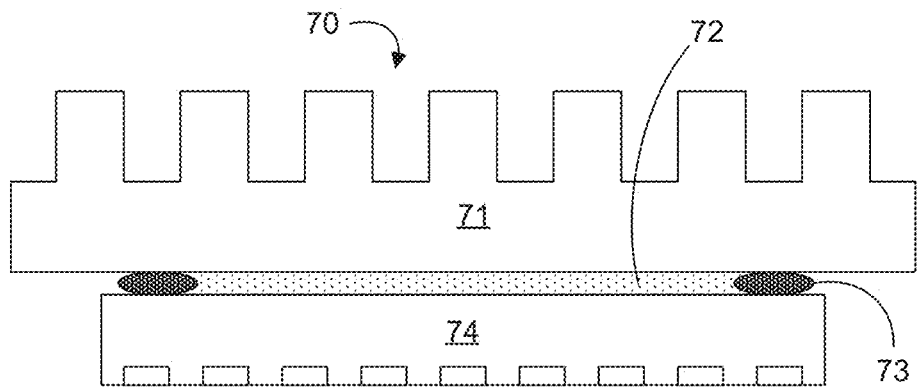

With reference to FIGS. 6A and 6B, an embodiment of an electronic memory apparatus 60 may include a top SSD enclosure 61, LTIM 62, a flexible LTIM retention ring 63, an electronic component 64, a SSD substrate 65, and a bottom SSD enclosure 66. During SSD manufacturing, the LTIM retention ring 63 may be put in place and secured on top of the electronic component 64 with thermal glue, thermal tape or similar materials. After the LTIM retention ring 63 is in place, the LTIM 62 may be dispensed inside the LTIM retention ring 63. The top SSD enclosure 61 may then be put in place, and the height of the LTIM retention ring 63 is automatically adjusted/compressed/collapsed to fill the gap and disperse the LTIM 62 to thermally couple the electronic component 64 to the top SSD enclosure 61. LTIM 62 of a wide range of viscosities (e.g., from low viscosity (e.g., watery) to high viscosity (e.g., gel-like)) may be effectively retained in the reservoir formed by the ring 63 on the component 64. During placement of the top SSD enclosure 61, some of the LTIM 62 may overflow. Such overflow would not be a significant problem because most of the LTIM 62 would remain inside the ring 63. The size of the ring 63 and the amount of the LTIM 62 are selected based on the desired thermal transfer properties.

With reference to FIGS. 7A to 7E, an embodiment of an electronic apparatus 70 may include a heatsink 71, LTIM 72, a flexible o-ring 73, and an electronic device package 74. During assembly, the o-ring 73 may be put in place and secured on top of the electronic device package 74. For example, the o-ring 73 may have some inherent or applied tackiness to keep the o-ring 73 in place on the package 74. Alternatively, or additionally, the o-ring may be secured with an additional adhesive (e.g., glue, tape, thermal grease, thermal glue, thermal tape, etc.) or similar materials. After the o-ring 73 is in place, the LTIM 72 may be dispensed inside the o-ring 73. The heatsink 71 may then be pressed against the package 74 and secured with clips, fasteners, additional adhesive, etc. The o-ring 73 is compressed by the force of the heatsink 71 being secured to the package 74, and the LTIM 72 becomes dispersed within the o-ring 73 to thermally couple the electronic device package 74 to the heatsink 71. LTIM 72 of a wide range of viscosities (e.g., from low viscosity to high viscosity) may be effectively retained in the reservoir formed by the o-ring 73 on the package 74. The size of the o-ring 73 and the amount of the LTIM 72 are selected based on the desired thermal transfer properties. In some embodiments, the o-ring 73 itself may be made from thermally conductive materials such as thermal foam, thermal rubber, etc. For example, thermal foam may be open cell or closed cell and may include ceramic particles or other material to provide thermal conductivity.

Figure 8A:
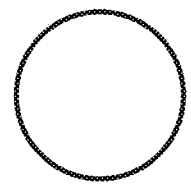
FIGS. 8A to 8J are top views of examples of respective flexible retention bands according to embodiments.
Figure 8B:
Figure 8C:
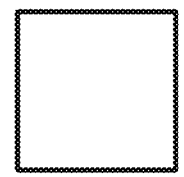
Figure 8D:
Figure 8E:
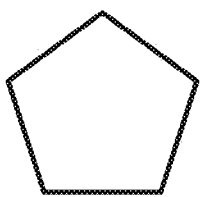
Figure 8F:
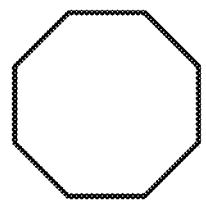
Figure 8G:
Figure 8H:
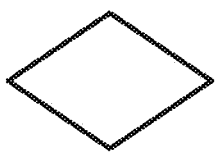
Figure 8I:
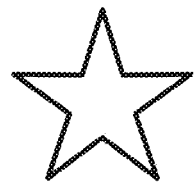
Figure 8J:
Figure 9A:
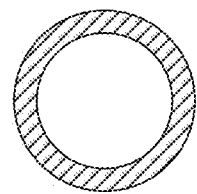
FIGS. 9A to 9H are cross section views of examples of flexible retention bands according to embodiments.
Figure 9B:
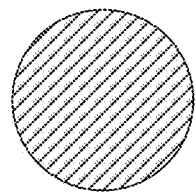
Figure 9C:
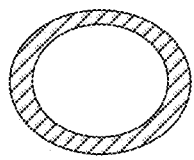
Figure 9D:
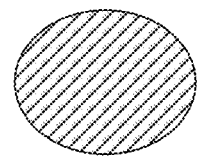
Figure 9E:
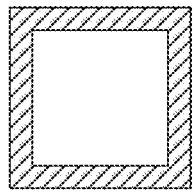
Figure 9F:
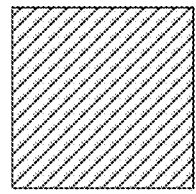
Figure 9G:
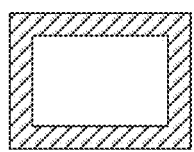
Figure 9H:
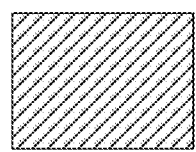

With reference to FIGS. 8A to 8J, embodiments of respective flexible retention bands may include any suitable shape and size, and may be constructed from any suitable materials. For example, thermal foam and/or thermal rubber may be formed or cut into a variety of closed loop structures to form a suitable barrier/reservoir/dam for the TIM on top side of a device package. Non-limiting examples of suitable shapes include circles or rings (FIG. 8A), ovals (FIG. 8B), squares (FIG. 8C) or rectangles (FIG. 8D), other polygons (FIGS. 8E to 8I), and racetrack shapes (FIG. 8J).

With reference to FIGS. 9A to 9H, embodiments of flexible retention bands may have any suitable cross section. For example, some bands may be formed as tubes/sleeves with hollow cross sections (e.g., see FIGS. 9A, 9C, 9E, 9G). Alternatively, some bands may be formed with substantially solid cross sections (e.g., see FIGS. 9B, 9D, 9F, 9H), although the material may not be completely solid (e.g., open cell thermal foam). If hollow, the properties of the tube/sleeve should provide sufficient rigidity to hold its shape when the LTIM is dispersed. If solid, the properties of the band should provide sufficient flexibility to deform when compressed. Those skilled in the art will appreciate that none of the figures herein are to scale. Instead, various features are exaggerated for the purpose of explanation and illustration. Although completely implementation specific, a typical uncompressed size for the flexible retention rings/bands herein range from about 1 mm to 2 mm A typical compressed size for the flexible retention rings/bands herein range from about 0.5 mm to 1 mm.

Figure 10A:
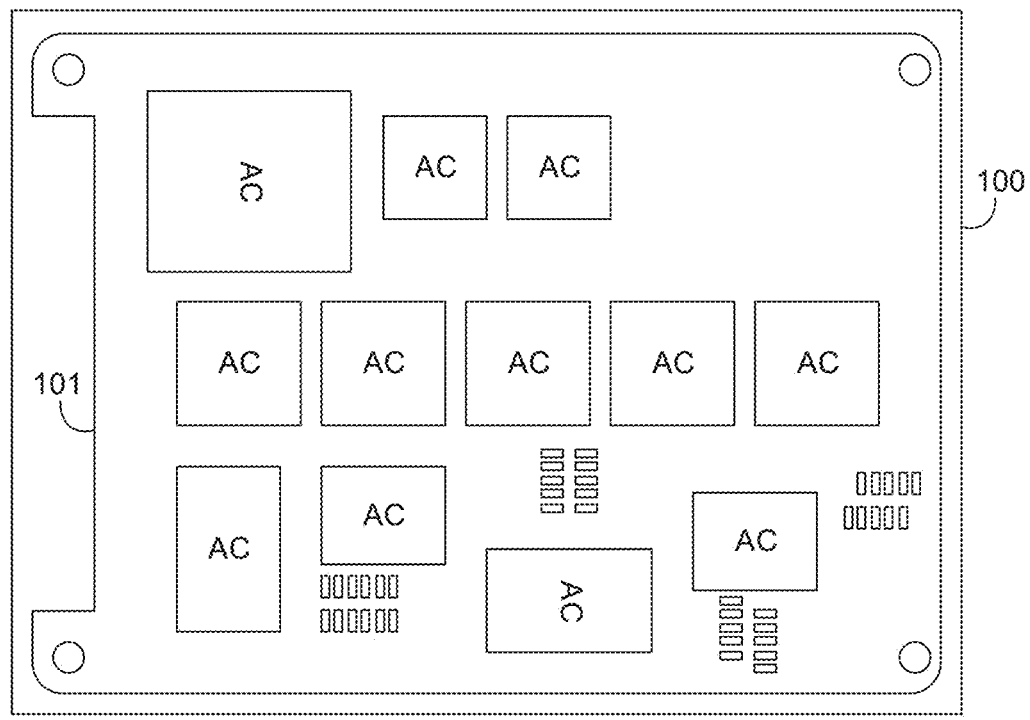
FIGS. 10A to 10B are block diagrams of an example of a memory device and respective flexible reservoir structures according to embodiments.
Figure 10B:
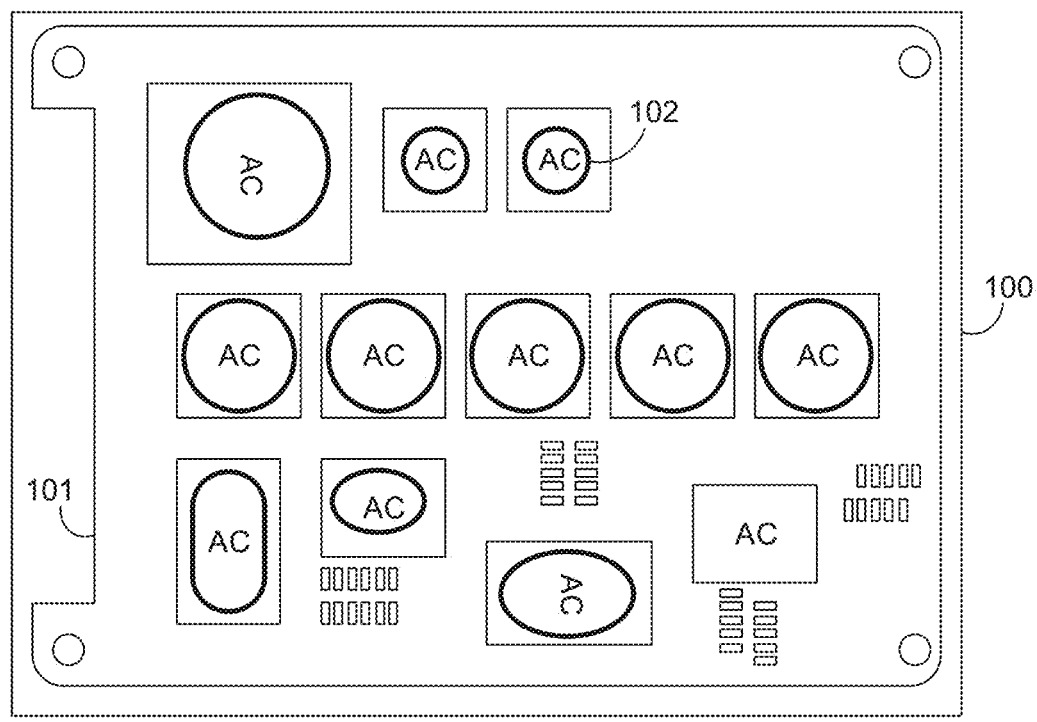

With reference to FIGS. 10A to 10B, embodiments of a memory device 100 may utilize a variety of flexible reservoir structures. The memory device 100 may include a printed circuit board (PCB) 101 with a plurality of active components (AC) mounted on the PCB 101. Non-limiting example ACs include a controller, an application specific integrated circuit (ASIC), non-volatile memory (NVM) such as NAND chips, volatile memory such as SRAM chips, etc. FIG. 10B shows how one or more of the ACs (but not necessarily all ACs) may have flexible retention bands 102 placed thereon. As shown in FIG. 10B, the flexible retention bands 102 may have a variety of shapes, may cover varying amounts of the tops of the AC packages, and may be centered or off-center on the AC packages. For example, the material of the flexible retention bands 102 may be readily compressed from a thickness of about 1 mm to a thickness of about 0.5 mm when a top enclosure of the memory device 100 is fastened onto the memory device 100.

The technology discussed herein may be provided in various computing systems (e.g., including a non-mobile computing device such as a desktop, workstation, server, rack system, etc., a mobile computing device such as a smartphone, tablet, Ultra-Mobile Personal Computer (UMPC), laptop computer, ULTRABOOK computing device, smart watch, smart glasses, smart bracelet, etc., and/or a client/edge device such as an Internet-of-Things (IoT) device (e.g., a sensor, a camera, etc.)).

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C. Various components of the systems described herein may be implemented in software, firmware, and/or hardware and/or any combination thereof. For example, various components of the systems or devices discussed herein may be provided, at least in part, by hardware of a computing SoC such as may be found in a computing system such as, for example, a smart phone. Those skilled in the art may recognize that systems described herein may include additional components that have not been depicted in the corresponding figures. For example, the systems discussed herein may include additional components such as bit stream multiplexer or de-multiplexer modules and the like that have not been depicted in the interest of clarity.

While implementation of the example processes discussed herein may include the undertaking of all operations shown in the order illustrated, the present disclosure is not limited in this regard and, in various examples, implementation of the example processes herein may include only a subset of the operations shown, operations performed in a different order than illustrated, or additional operations.

In addition, any one or more of the operations discussed herein may be undertaken in response to instructions provided by one or more computer program products. Such program products may include signal bearing media providing instructions that, when executed by, for example, a processor, may provide the functionality described herein. The computer program products may be provided in any form of one or more machine-readable media. Thus, for example, a processor including one or more graphics processing unit(s) or processor core(s) may undertake one or more of the blocks of the example processes herein in response to program code and/or instructions or instruction sets conveyed to the processor by one or more machine-readable media. In general, a machine-readable medium may convey software in the form of program code and/or instructions or instruction sets that may cause any of the devices and/or systems described herein to implement at least portions of the operations discussed herein and/or any portions the devices, systems, or any module or component as discussed herein.

As used in any implementation described herein, the term "module" refers to any combination of software logic, firmware logic, hardware logic, and/or circuitry configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, fixed function circuitry, execution unit circuitry, and/or firmware that stores instructions executed by programmable circuitry. The modules may, collectively or individually, be embodied as circuitry that forms part of a larger system, for example, an integrated circuit (IC), system on-chip (SoC), and so forth.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as IP cores may be stored on a tangible, machine readable medium and supplied to various customers or manufacturing facilities to load into the fabrication machines that actually make the logic or processor.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments are not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. An electronic apparatus, comprising:
   an electronic device package having a first surface;
   a heat conductive structure having a second surface;
   a band of flexible material positioned between the first surface of the electronic device package and the second surface of the heat conductive structure; and
   a thermal interface material disposed within a reservoir structure between the first surface of the electronic device package and the second surface of the heat conductive structure to place the first surface in thermal communication with the second surface,
   wherein the band of flexible material is compressed to a thickness of between about twenty five and fifty percent of an uncompressed thickness of the band of flexible material, wherein the band comprises a ring of compressible material, and wherein the ring of compressible material comprises a spring coil.

2. The electronic apparatus of claim 1, wherein the thermal interface material comprises a liquid thermal interface material.

3. The electronic apparatus of claim 1, wherein the heat conductive structure comprises an enclosure of the electronic apparatus.

4. The electronic apparatus of claim 1, further comprising:
a thermal adhesive positioned between the band of flexible material and the first surface of the electronic device package.

5. An electronic apparatus, comprising:
an electronic device package having a first surface;
a heat conductive structure having a second surface;
a band of flexible material positioned between the first surface of the electronic device package and the second surface of the heat conductive structure; and
a thermal interface material disposed within a reservoir structure between the first surface of the electronic device package and the second surface of the heat conductive structure to place the first surface in thermal communication with the second surface,
wherein the band of flexible material is compressed to a thickness of between about twenty five and fifty percent of an uncompressed thickness of the band of flexible material, and wherein the band comprises a collapsible ring.

6. The electronic apparatus of claim 5, wherein the collapsible ring comprises two or more concentric cylinders.

7. The electronic apparatus of claim 5, wherein the thermal interface material comprises a liquid thermal interface material.

8. The electronic apparatus of claim 5, wherein the heat conductive structure comprises an enclosure of the electronic apparatus.

9. The electronic apparatus of claim 5, further comprising:
a thermal adhesive positioned between the band of flexible material and the first surface of the electronic device package.

10. An electronic memory apparatus, comprising:
an enclosure having a first side and a second side opposed to the first side, wherein at least the first side of the enclosure comprises a thermally conductive material;
a memory device positioned within the enclosure and disposed between the first and second sides of the enclosure, the memory device including two or more electronic components secured to a substrate;
one or more reservoir structures respectively formed between one or more of the two or more electronic components of the memory device and the first side of the enclosure; and
thermal interface material retained within the one or more reservoir structures and in thermal communication with both the respective electronic components and the first side of the enclosure,
wherein at least one of the one or more of the reservoir structures comprises a band of flexible material, and wherein at least one of the one or more of the reservoir structures is off-center on one of the two or more electronic components of the memory device.

11. The apparatus of claim 10, wherein the band comprises a ring of compressible material.

12. The apparatus of claim 11, wherein the ring of compressible material comprises a spring coil.

13. The apparatus of claim 10, wherein the band comprises a collapsible ring.

14. The apparatus of claim 13, wherein the collapsible ring comprises two or more concentric cylinders.

15. The apparatus of claim 10, wherein the thermal interface material comprises a liquid thermal interface material.

16. The apparatus of claim 10, further comprising:
a thermal adhesive respectively positioned between the one or more reservoir structures and the one or more of the two or more electronic components of the memory device.

* * * * *